United States Patent [19]

Villa et al.

[11] Patent Number: 4,672,235

[45] Date of Patent: Jun. 9, 1987

[54] BIPOLAR POWER TRANSISTOR

[75] Inventors: Flavio Villa, Milan; Bruno Murari, Monza; Carlo Cini, Cornaredo; Franco Bertotti, Milan, all of Italy

[73] Assignee: SGS Microelettronica S.p.A., Agrate, Italy

[21] Appl. No.: 736,810

[22] Filed: May 21, 1985

[30] Foreign Application Priority Data

May 21, 1984 [IT] Italy .................... 21028 A/84

[51] Int. Cl.$^4$ ............................................. H03K 17/60
[52] U.S. Cl. .................... 307/255; 307/299 R; 307/310; 307/313
[58] Field of Search ............... 307/310, 254, 255, 303, 307/299 R, 313

[56] References Cited

U.S. PATENT DOCUMENTS

| | | | |
|---|---|---|---|
| 3,810,006 | 5/1974 | Vittoz | 307/255 |
| 4,224,537 | 9/1980 | Glazel | 307/310 |
| 4,423,357 | 12/1983 | Engelman et al. | 307/255 |

Primary Examiner—Stanley D. Miller
Assistant Examiner—B. P. Davis
Attorney, Agent, or Firm—Harry M. Wiess & Associates

[57] ABSTRACT

A power transistor comprising a plurality of elementary transistors coupled in parallel and an identical number of current generators, each of which has a terminal coupled individually to the base of an elementary transistor is described. High power levels may be achieved with a transistor of this type without forward secondary breakdown taking place.

1 Claim, 2 Drawing Figures

BIPOLAR POWER TRANSISTOR

BACKGROUND OF THE INVENTION

1. Field of the Invention

The present invention relates to a semiconductor device and, more particularly, to a bipolar power transistor.

2. Discussion of the Related Art

Power transistors must be able to withstand comparatively high power levels, and therefore comparatively high currents and voltages for sufficiently long periods of time. In order to increase the current value, emitter geometries having a high ratio between perimeter and area are provided, for example interdigital structures, so as to limit the phenomenon known as "emitter crowding" which, as is known, involves a crowding of the current in the peripheral zones of the emitter-base junction resulting in a degradation of the current gain.

A power transistor having an interdigital structure is formed from a plurality of identical elementary transistors having their collectors, as well as their emitters, connected together. Moreover, in a conventional structure of this type, the bases of the elementary transistors are connected together, as a result of which their relative base-emitter voltages are linked. In practice, the elementary transistors can only be considered to be roughly identical as they differ in general both with respect to their electrical properties and their operating temperatures. In particular, if there is an increase in the collector-emitter voltage, the current, rather than being distributing uniformly throughout all the elementary transistors, can be predominantly concentrated in certain transistors, as a result of which the power produced is substantially lower than the maximum power which the overall transistor could provide and regenerative processes leading to the breakdown of the transistor itself can occur. This breakdown mechanism, known as "forward secondary breakdown" (I s/b) is one of the major drawbacks of conventional power transistors.

SUMMARY OF THE INVENTION

It is therefore an object of the present invention to provide a power transistor that is activated in a uniform manner over its entire surface area, even with high collector-emitter voltage values, and is therefore able to provide power at a level which is substantially higher than the power provided by a conventional power transistor, without forward secondary breakdown taking place.

This and other objects are accomplished, according to the present invention, by controlling the base current of each of the elementary transistors of the bipolar power transistor with an associated transistor. The associated transistor reduces the temperature dependence of the current flowing through the elementary transistor and reduces the resulting operating instabilities of the elementary transistor.

These and other features of the present invention will be understood upon reading of the following description along with the drawings.

DESCRIPTION OF THE PREFERRED EMBODIMENT

Figure 1:
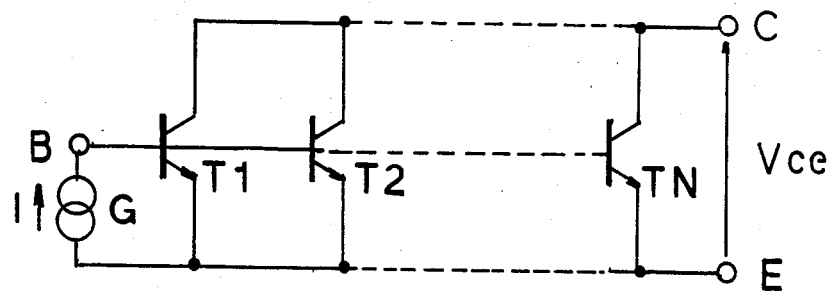
FIG. 1 shows a circuit including the simplified equivalent circuit diagram of an n-p-n power transistor of known type.

The equivalent circuit of FIG. 1 comprises N elementary transistors T1, T2 to TN of n-p-n type, having common collector, emitter and base electrodes, whose terminals are indicated by C, E and B respectively. The N elementary transistors are driven by a control stage G, shown in the Figure by a current generator, which supplies a current I to the base electrode. At a given moment of operation, there is a voltage Vce between the collector and emitter electrodes. If the transistors T1, T2 to TN are identical, the current I is distributed uniformly between the N bases. The N transistors therefore have an identical collector current Ic and each transistor dissipates a power IcVce. In this situation, if the current I supplied by the generator increases, the collector currents and the dissipation increases in the same way in the N transistors.

As mentioned above, in practice it is very probable that the properties of the elementary transistors and their operating temperatures differ. These differences become significant when the voltage Vce increases and can lead to thermal and electrical instability. The instability can cause the transistor to malfunction as a result of secondary breakdown. If, for example, the transistor T2 is at a slightly higher temperature than the other transistors, because its base-emitter voltage cannot decrease as it is linked to the voltage of the other transistors, its base current and therefore its collector current, increases (Ic increased by approximately 8% per °C. for small temperature variations) and its dissipation also increases to the detriment of the other transistors. This causes a substantial increase in the temperature of T2 which leads to a further increase in the power which it dissipates. This effect is cumulative and the current I may possibly flow almost entirely within the base of T2.

The situation described above takes place as a result of the fact that the elementary transistors are not independent with the result that, if one transistor is operating abnormally, it affects the behaviour of the others.

A known solution to the problem of secondary breakdown is to insert a resistor, called a ballast resistor, in series with the emitter of each elementary transistor so as to introduce a negative feedback which stabilities the behaviour. A further known solution, disclosed, for example, in the British Patent Specification No. 1,467,612, is to replace each elementary n-p-n transistors comprising a drive transistor is thermally coupled to the drive transistor of another pair instead of the drive transistor of its own pair so as to enable heat imbalances to be compensated. However, these solutions only provide a partial solution to the problem of secondary breakdown and, in addition, involve a higher saturation voltage.

Figure 2:
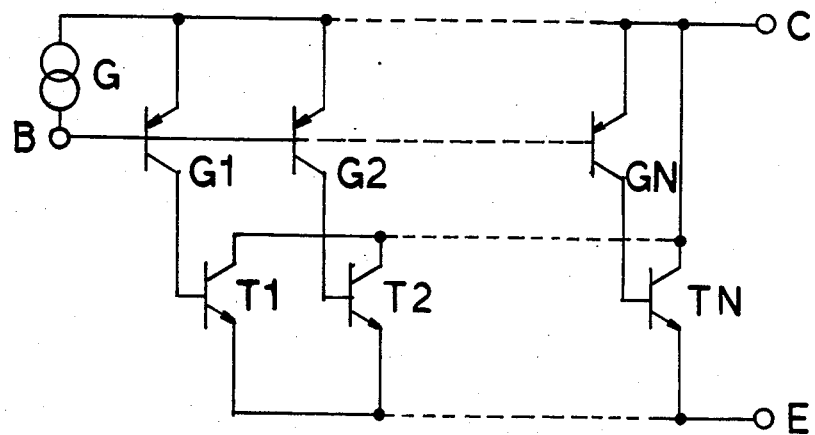
FIG. 2 shows a circuit including the simplified equivalent circuit diagram of an n-p-n power transistor of the invention.

The above-described problem is solved in a power transistor of the invention, an embodiment of which is shown in outline circuit diagram form in FIG. 2. In FIG. 2, the base electrodes of the transistors T1, T2 to TN, instead of being coupled together as in FIG. 1, are independent of one another and each transistor base is driven by its own current generator in the form of a bipolar transistor of p-n-p type whose collector electrode is coupled to the base electrode itself. THe N p-n-p transistors are shown in the Figure by G1, G2 to GN. They have their emitter electrodes coupled together to the collector electrode C of the power transistors, and their base electrodes joined together and coupled, via the base electroce B, to the output of a control stage G, shown in the Figure by a current generator. The control transistors G1, G2 to GN have a substantially lower dissipation level than the output transistors T1, T2 to TN as they only supply the base currents for these transistors and are not, therefore, subject to secondary breakdown.

In the power transistor of the invention, the elementary transistors T1, T2 to TN are all controlled with respect to their current (the base current) and their relative base-emitter voltages are not linked to one another. If the thermal or electrical situation changes, the base-emitter voltage of each elementary transistor may be modified as a result of which there are negligible repercussions on the collector current of the transistor itself. This current is in effect only influenced by the variation of the current gain with the temperature. As known, these variations are approximately 0.5% per °C. and are substantially lower than the variations of approximately 8% per °C. taking place in the circuit of FIG. 1. The current distribution is uniform over the entire area of the power transistor which is therefore about to supply much higher powers.

The power transistor of the invention may be constructed as a monolithic integrated circuit using conventional integration techniques for bipolar circuits, such as, for example, the planar technique used to obtain the structure disclosed in the U.S. patent specification No. 3,544,860. The transistors T1, T2 to TN are preferably vertical n-p-n transistors and the transistors G1, G2 to GN are preferably lateral p-n-p transistors. It will also be clear to those skilled in the art that the n-p-n and p-n-p transistors can be interchanged without departing from the basic techniques of the invention.

The foregoing description is included to illustrate the operation of the preferred embodiment and not means to limit the scope of the invention. The scope of the invention is to be limited only by the following claims. From the foregoing discussion, many variations will be apparent to one skilled in the art that would yet be encompassed by the spirit and scope of the inventions.

What is claimed is:

1. A bipolar power transistor having a base terminal, an emitter terminal, and a collector terminal and adapted for driving by a current source coupled to said base terminal comprising, in combination:
   a first plurality of elementary bipolar transistors of first conductivity type and having emitter electrodes, base electrodes, and a common collector electrode, said common collector electrode being connected directly to said collector terminal of said power transistor, and said emitter electrodes being connected directly to said emitter terminal of said power transistor;
   a second plurality of bipolar transistors of a second conductivity type opposite said first conductivity type and having a common emitter electrode connected to said collector terminal of said power transistor, a common base electrode connected to said base terminal of said power transistor, and each of said second plurality of bipolar transistors having a collector electrode connected to a respective one of said base electrodes of said first plurality of elementary bipolar transistors.

* * * * *